(12) United States Patent
Tamamoto et al.

(10) Patent No.: US 10,307,968 B2
(45) Date of Patent: Jun. 4, 2019

(54) HOLDING STRUCTURE OF AN ULTRASONIC VIBRATION TRANSMISSION MECHANISM

(71) Applicant: BRANSON ULTRASONICS CORPORATION, Danbury, CT (US)

(72) Inventors: Osamu Tamamoto, Atsugi (JP); Jun Pang, Atsugi (JP)

(73) Assignee: Branson Ultrasonics Corporation, Danbury, CT (US)

( * ) Notice: Subject to any disclaimer, the term of this patent is extended or adjusted under 35 U.S.C. 154(b) by 0 days.

(21) Appl. No.: 15/750,408

(22) PCT Filed: Aug. 3, 2016

(86) PCT No.: PCT/US2016/045361
§ 371 (c)(1),
(2) Date: Feb. 5, 2018

(87) PCT Pub. No.: WO2017/024041
PCT Pub. Date: Feb. 9, 2017

(65) Prior Publication Data
US 2018/0222123 A1 Aug. 9, 2018

(30) Foreign Application Priority Data

Aug. 6, 2015 (JP) .................................. 2015-156073

(51) Int. Cl.
| B32B 37/00 | (2006.01) |
| B29C 65/00 | (2006.01) |
| B23K 20/10 | (2006.01) |
| B29C 65/08 | (2006.01) |
| F16F 15/04 | (2006.01) |

(Continued)

(52) U.S. Cl.
CPC ............ *B29C 66/816* (2013.01); *B23K 20/10* (2013.01); *B23K 20/106* (2013.01); *B29C 65/08* (2013.01);

(Continued)

(58) Field of Classification Search
CPC ..... B29C 65/08; B29C 66/816; B65B 51/225; B23K 20/106; B23K 20/10

(Continued)

(56) References Cited

U.S. PATENT DOCUMENTS

| 3,752,380 A | 8/1973 | Shoh |
| 5,305,556 A | 4/1994 | Kopp et al. |

(Continued)

FOREIGN PATENT DOCUMENTS

| JP | S492753 A | 1/1974 |
| JP | 2911394 B2 | 6/1999 |

(Continued)

OTHER PUBLICATIONS

International Search Report and Written Opinion of the International Searching Authority issued in PCT/US2016/045361, dated Oct. 31, 2016; ISA/US.

*Primary Examiner* — James D Sells
(74) *Attorney, Agent, or Firm* — Harness, Dickey & Pierce, P.L.C.

(57) ABSTRACT

A holding structure (2) in an ultrasonic vibration welding device that welds workpieces by applying ultrasonic waves to the workpieces holds an ultrasonic vibration transmitter (horn) (5) bearing the transmission of longitudinally vibrating ultrasonic waves in holding members (8, 8). The horn comprises a horn body (51) having the length of one-half the wavelength λ of the ultra-sonic vibration. Holding structure (2) includes holders (7x, 7y) having a prescribed volume and thin sheet connectors (6a, 6b) placed at different positions (Pa, Pb) on the horn body (51). The horn body (51) is fixed to holding members (8, 8) by means of the respective holders (7x, 7y).

9 Claims, 4 Drawing Sheets

(51) Int. Cl.
  *H01L 41/053*  (2006.01)
  *H02N 2/04*  (2006.01)
(52) U.S. Cl.
  CPC ........ *B29C 65/081* (2013.01); *B29C 66/1122* (2013.01); *B29C 66/41* (2013.01); *B29C 66/45* (2013.01); *F16F 15/04* (2013.01); *H01L 41/053* (2013.01); *H02N 2/04* (2013.01)
(58) Field of Classification Search
  USPC ...................................................... 156/580.1
  See application file for complete search history.

(56) References Cited

U.S. PATENT DOCUMENTS

| | | | |
|---|---|---|---|
| 5,976,316 A | 11/1999 | Mlinar et al. | |
| 6,247,628 B1 | 6/2001 | Sato et al. | |
| 7,766,067 B2 | 8/2010 | Voss | |
| 7,802,604 B2 | 9/2010 | Martin et al. | |
| 8,201,722 B2 | 6/2012 | Sato et al. | |
| 2007/0199972 A1* | 8/2007 | Chong | B06B 3/00 228/1.1 |
| 2009/0266869 A1* | 10/2009 | Sato | B23K 20/10 228/1.1 |
| 2011/0042014 A1 | 2/2011 | Vogler | |
| 2013/0306219 A1 | 11/2013 | Herrmann et al. | |

FOREIGN PATENT DOCUMENTS

| | | |
|---|---|---|
| JP | 2915340 B2 | 7/1999 |
| JP | 2984225 B2 | 11/1999 |
| JP | 2001334494 A | 12/2001 |
| JP | 3373810 B2 | 2/2003 |
| JP | 5167129 B2 | 3/2013 |

* cited by examiner

HOLDING STRUCTURE OF AN ULTRASONIC VIBRATION TRANSMISSION MECHANISM

FIELD

The Invention relates to an improvement in the holding structure of an ultrasonic vibration transmission mechanism bearing ultrasonic transmissions in an ultrasonic welding device that welds workpieces by applying ultrasonic waves to those workpieces.

BACKGROUND

The known ultrasonic welding device in prior art is a device that converts ultrasonic wave electrical energy from an ultrasonic wave generator into mechanical vibratory energy by a convertor (ultrasonic wave oscillator) and supplies this mechanical vibratory energy to an ultrasonic vibration transmitter (a horn) after amplification with a booster; after resonating in mechanical vibrations at the horn, frictional heat occurs on workpieces by the mechanical vibratory energy of this resonance imparted to the workpieces, and the workpieces are welded by the frictional heat occurring on the workpieces. These ultrasonic welding devices fall into the classification of those that render plastic welding and those that render metal welding. Also, the ultrasonic vibration transmission mechanism (ultrasonic stack) is constructed with the booster and the horn in the above-mentioned ultrasonic welding devices. The ultrasonic vibration transmitter structure (ultrasonic stack) may also include a construction that adds a converter to the booster and the horn.

Various kinds of construction have been proposed in the prior art for a structure that holds this ultrasonic vibration transmitter structure (ultrasonic stack), depending on whether it is to be used for plastic welding or metal welding.

However, on the metal surface in the above-mentioned ultrasonic vibration transmitter, there is no vibration zero point, and the entire surface vibrates. The vibration zero point called the nodal point exists only on the 1 axial point (in brief, the interior horn material), and vibration is zero is in all directions, axial and rectangular. Generally, this is called a node; however, the amount of bulge vibration of the surface is at a maximum. This amount increases for the horn shape and has a greater amplitude in relation to Poisson's ratio, as the diameter is large in the case of a controlling cylindrical rod and as the sheet is thick in the case of the sheet. Therefore, the holder of the ultrasonic vibration transmission mechanism cannot be operated easily, even by using a node; wherefore, various holding methods have been proposed previously.

The representative holding structure of an ultrasonic vibration transmission mechanism for plastic welding, as discussed in paragraphs [0040] and [0041] of Patent Reference 2, proposes a holding structure that disposes a flange in a unified manner on the horn or booster, uses an elastic member such as a rubber O-ring or heat resistant plastic sheet and holds the horn or booster in a support framework by inserting one or both faces of the flange by means of the elastic member. It is necessary that this holding structure be a structure that holds the horn or booster in a support framework by an axial 1-point support. This means that the holding place is a single axial position, and, when supported there, even a construction that temporarily supports this place with several support frameworks, is called a 1-point support. Another example of a holding structure that is a 1-point axial support of an ultrasonic vibration transmission mechanism proposes a holding structure that disposes an S-shaped flange in the booster and holds the booster in the frame by the S-shaped flange (Patent Reference 3, Patent Reference 4).

FIG. 7 is an oblique view showing a typical holding structure with an S-shaped flange of the abovementioned prior art. FIG. 8 is a side view showing a typical holding structure with an S-shaped flange. In FIGS. 7 and 8, the horn 50 has a prescribed length and is formed as a rectangular column on the top side shown in FIG. 7 and the top side in FIG. 8 approximately in the middle of it; when the bottom side shown in FIG. 7 and the bottom side shown in FIG. 8 gradually taper over a prescribed length from approximately in the middle, it takes on a uniform thickness after reaching a prescribed thickness. At the approximate middle of the horn 50, as shown in FIGS. 7 and 8, an S-shaped flanged 60 is disposed. The horn 50 constructs a holding structure by means of the S-shaped flange that is being held fast to a holder not shown in the figures.

On the other hand, for the holding structure of an ultrasonic vibration transmission mechanism for metal welding, support by such a plastic sheet elastic member is insufficient, wherefore a holder by means of metal contact is desirable. However, even with a holding element by metal contact, a spring construction is necessary to absorb the bulge vibrations on the holder. For this reason, it would be necessary to reduce vibration leaks after affixing the holder to an actuator. When there is metal contact, there is generally a support at 2 places separated axially, so that the increased pressure on the horn (pressure added to the workpiece) is rectangular, as opposed to axial.

Concretely, as mentioned in Patent Reference 5, a holding structure is proposed that fixes to a support with support members in two places of the anti-node that arises on the horn (resonator), that is on two anti-nodes at a distance of one wavelength of the ultrasonic wave oscillation on the horn, and, as mentioned in Patent Reference 6, a construction by inserting disk-shaped metal flat plates called diaphragms on two anti-nodes on the booster—that is, on two anti-nodes at a distance of one-half wavelength of the ultrasonic wave oscillation on the booster.

As stated in Patent Reference 7, a holding structure is proposed that disposes an S-shaped spring structure in the vicinity (length of one-half wavelength) of the amplitude zero of the ultrasonic wave horn and is fixed to a frame with such S-shaped spring construction.

Furthermore, as stated in Patent Reference 8, a holding structure is proposed that disposes a booster one wavelength behind the horn and is held to a support via a flange on the node of the respective rear booster [positioned at 1 and a half wavelengths (1.5 wavelengths)].

Each of the holding structures proposes a construction that holds the horn or booster at two place separated axially by one-half wavelength or 1.5 wavelengths.

PRIOR ART REFERENCES

Patent References

Patent Reference 1 U.S. Pat. No. 2,984,225
Patent Reference 2 Patent Kokai No. 2001-334494
Patent Reference 3 US Patent 2013/0306219
Patent Reference 4 U.S. Pat. No. 5,167,129
Patent Reference 5 Patent Kokai No. S49-2753
Patent Reference 6 U.S. Pat. No. 2,915,340
Patent Reference 7 U.S. Pat. No. 3,373,810
Patent Reference 8 U.S. Pat. No. 2,911,394

SUMMARY OF THE INVENTION

Problems the Invention Seeks to Solve

The holding structure of an axial 1-point support in the ultrasonic vibration welding device of the abovementioned prior art has the shortcoming of weak rigidity in the axial and rectangular directions, regardless of whether it used for metal or plastic welding.

Also, support by means of several support members in a 1-point support place, being another holding structure in the holding structure of an axial 1-point support, has the shortcoming of insufficient rectangular rigidity in opposition to the transverse axial direction because of weak rigidity of the side where the support members are disposed.

Furthermore, there is a shortcoming in the ultrasonic vibration welding device of the prior art such that when the construction becomes larger, the holding structure is held in two places of the anti-node on a one-wavelength horn making the one-wavelength horn necessary.

Then, another shortcoming in the ultrasonic vibration welding device of prior art is that the construction becomes larger in a similar manner with the abovementioned 2-place holding structure inasmuch as in order for the holding structure support in 2 places at a distance of a half wavelength on the booster to have effective rigidity for the increased pressure in axial and rectangular directions, it is necessary to have holders for 2 places on the booster.

A shortcoming in the ultrasonic vibration welding device of prior art is that the construction becomes larger in a similar manner to the other above-mentioned 2-place holding structure, because other interference occurs with the holding structure that is supported in two places at a distance of a half wavelength on the horn.

In order to solve the problems in the abovementioned prior art, an object of the present invention is to design efficient vibration transmission together with enhanced holding rigidity; a holding structure for an ultrasonic vibration transmission mechanism is proposed that can avoid damage to structural parts. That is, it has thin sheet connectors in two places, the anti-node and node, of the ultrasonic wave horn; it absorbs bulge vibrations of the node and bending vibrations of the longitudinal vibration by means of the thin sheet connectors; and there are no vibration leaks of bulge vibrations and bending vibrations in the space going towards the holding block. Generally, manufacturing itself uses a wire process, during which the distance for the supports is ¼ wavelength. Also, the holder is made in one piece with the main body, so both metal and high-pressure plastic welding applications are possible with completely enhanced holding rigidity by shortening the distance from supporting parts to the welder; furthermore, holding by means of a booster is not necessary.

The thickness of the thin sheet connectors has a relationship to vibration leaks and static pressure rigidity toward the holder. If this is thinner, vibration leaks are fewer, and static pressure rigidity decreases; conversely, if thicker, vibration leaks increase, and static pressure rigidity is greater. The thickness of the thin sheet connectors is determined in consideration of the actual static pressure to be added.

Means for Solving the Problems

To attain the abovementioned objects, the holding structure of the ultrasonic vibration transmission mechanism according to Claim 1 of the invention comprises a horn body formed as a solid body of a prescribed length, holders which make the horn body face the center and two connectors provided in different axial positions on the horn body in order to maintain a space between the horn body and the respective holders made as one piece in an ultrasonic vibration welding device that can weld pieces by frictional heat on the pieces by applying an ultrasonic wave machine's vibrational energy to pieces from a horn resonating in ultrasonic vibration. It is constructed to maintain a space between the horn body and the holders by means of thin sheet connectors in a 1st position on one edge of the horn body and to maintain a space between the horn body and the holders by means of thin sheet connectors in a 2nd position separated at a prescribed distance from the above-mentioned edge on another edge; the horn body is then fixed to the holding element by the respective holders.

The holding structure of the ultrasonic vibration transmission mechanism according to Claim 2 of the invention is that of Claim 1, wherein the horn body is nearly the length of one half wavelength of the applied ultrasonic wave; the $1^{st}$ position on one edge of the horn body is in the anti-node located on the horn when ultrasonic waves are applied to the horn body and flat thin sheet connectors are interposed in the abovementioned underneath position between the horn body and the respective holders; the $2^{nd}$ position separated at a prescribed distance from the above-mentioned edge on another edge is in the node located on the horn, and S-shaped thin sheet connectors are interposed at the node between the horn body and the respective holders.

The holding structure of the ultrasonic vibration transmission mechanism according to Claim 3 of the invention is that of Claims 1 and 2 in which the abovementioned S-shaped thin sheet connectors are constructed at a prescribed thickness of less than $5/100$ of a wave length of the ultrasonic wave transmitted, the flat thin sheet connectors are constructed at a prescribed thickness of less than $3/100$ of a wavelength of the ultrasonic wave transmitted, and the flat surface of the respective holders are disposed parallel to the wave surface of the longitudinally vibrating ultrasonic wave.

According to the holding structure of the ultrasonic vibration transmission mechanism as per the present invention, the ultrasonic vibration transmission element is fixed to the holding member by thin sheet connectors in the two different positions mentioned above on the ultrasonic vibration transmitter in the propagation direction of the longitudinal vibratory ultrasonic wave which the ultrasonic vibration transmitter propagates; therefore, it has the following effects:

(1) Because the respective thin sheet connectors and the horn are made into one body, even with the horn vibrating at a low frequency, vibration can be controlled, there is no bumping by the nodal part and, besides the control of fiction, stable welding can be expected.

(2) It is advantageous that rigidity in the axial and rectangular directions be high, inasmuch as the horn is held by holding members with flat thin sheet connectors on the anti-node of the horn and by S-shaped thin sheet connectors at the node of the horn.

Additionally, compared to the holding structures of prior art which support by means of several support members at a one-point support position, an enhancement in sufficient transverse axial and rectangular rigidity can be made.

(3) Compared to the holding structure of prior art that with an anti-node-anti-node holder (FIG. 8 of Patent Reference 6) and a node holder (Patent Reference 7), its construction is effectively miniaturized.

Moreover, compared to a holding structure that supports in 2 places at a distance of one half wavelength of the horn, a further advantage is that not only will no other interference arise, but that it can be structurally smaller.

In particular, when comparing the present invention with the one-point axial support known from prior art, regardless of whether or not contact is by metal contact, even if the rigidity towards increased pressure of the axial and parallel directions is the same, another advantage is that there is high rigidity towards the axial and rectangular directions. Even increasing the support places in a positions from the tip and axial direction as in Patent Reference 2, axial and rectangular rigidity towards the sides is insufficient. And, compared to the two place supports at a distance shown in FIG. 11 of Patent Reference 5, rigidity towards increased axial and rectangular pressure is an advantage. Since a holder for a booster element is not necessary, the entire length can be shortened correspondingly.

When compared to the supports on both sides of the one wavelength horn of Patent Reference 7, another advantage is that with no other interference in the manufacturing assembly line, space can be greatly economized.

With the nodal support of Patent Reference 1, a uniform effect was observed when limiting the vibration during welding to ultrasonic waves. However, due to the work resonance, in cases of the work bucking at low frequency, it is difficult to control the vibrations completely. Thus, bumping of the nodal part with the horn occurs, and chafing cannot be avoided.

In the present invention, on the other hand, since the thin sheet connectors and the horn are in one piece, vibrations can be controlled and stable welding can be expected, even when the horn is vibrating at low frequency.

DETAILED DESCRIPTION

Figure 4:
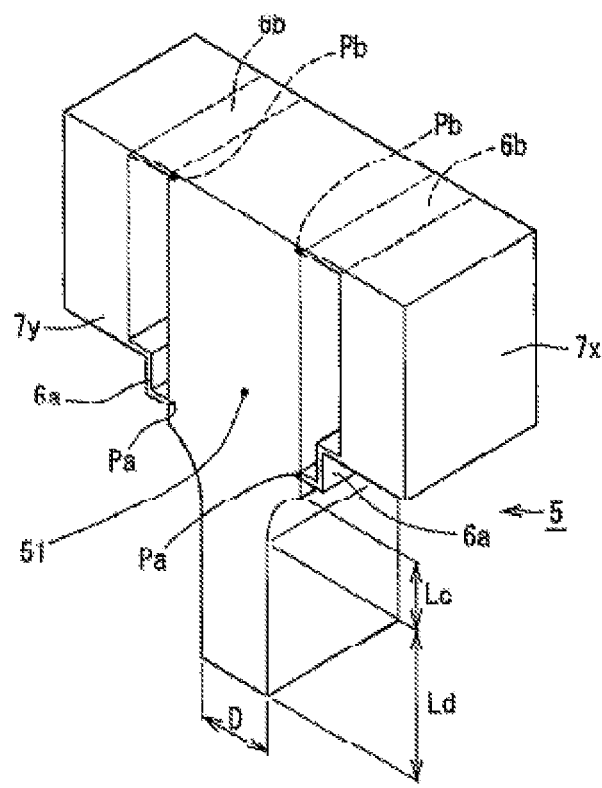
FIG. 4 is an oblique view typically showing the holding structure relating to an embodiment of the invention.
Figure 5:
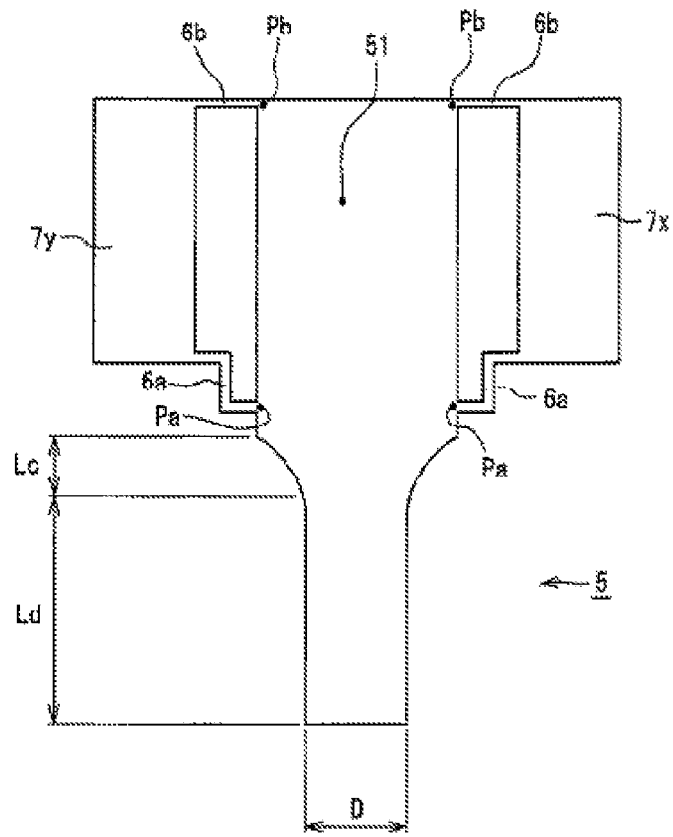
FIG. 5 is a side view typically showing the holding structure relating to an embodiment of the invention.

The holding structure 2 will be described in reference to FIGS. 4 and 5 which include FIGS. 1 to 3. The holding structure 2 is as follows. Namely, a space is maintained between the horn body 51 and holders 7x, 7y by thin sheet connectors 6b, 6b at a 1st position Pb on one edge of the horn body 51, and, having a structure that maintains a space between the horn body 51 and holders 7x, 7y by second thin sheet connectors 6a, 6a at a 2nd position separated a prescribed distance from the edge of the horn body 51 on an edge in another direction, the horn body 51 is fixed to holding members 8, 8 by the holders 7x, 7y.

Embodiments for Implementing the Invention

An embodiment of the invention will be described below, with reference to the figures.

FIGS. 1 to 5 are explanatory drawings showing the holding structure and the ultrasonic vibration transmitter relating to an embodiment of the invention.

Figure 1:
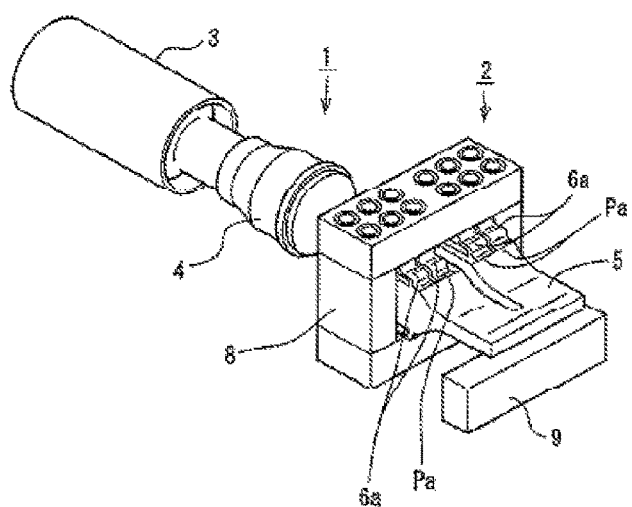
FIG. 1 is an oblique view showing the holding structure and the ultrasonic vibration transmitter relating to an embodiment of the invention.
Figure 2:
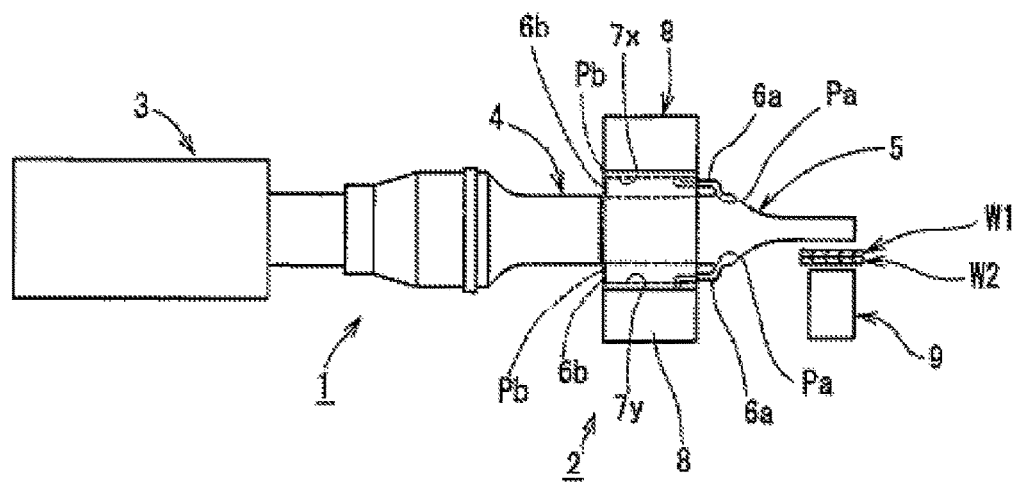
FIG. 2 is a plan view showing the holding structure and the ultrasonic vibration transmitter relating to an embodiment of the invention.
Figure 3:
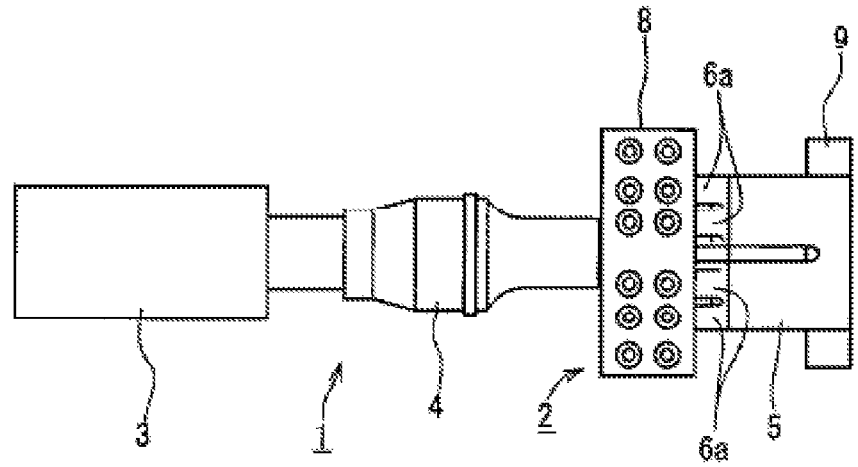
FIG. 3 is a side view showing the holding structure and the ultrasonic vibration transmitter relating to an embodiment of the invention.

FIGS. 1 to 3 of the drawings show the ultrasonic vibration transmission mechanism 1 and the holding structure 2 in the ultrasonic vibration welding device. In the drawings, the ultrasonic vibration transmission mechanism 1 is composed of an ultrasonic wave oscillator (convertor) 3, a booster 4 disposed on the same axis as the converter 3 and an ultrasonic vibration transmitter (horn) 5 disposed on the same axis as the booster 4. The holding structure 2 fixes the ultrasonic vibration transmitter (horn) 5 to the holding members 8 as shown in FIGS. 1 and 3.

The holding structure 2 will be described in reference to FIGS. 4 and 5 which include FIGS. 1 to 3. The holding structure 2 is as follows. Namely, a space is maintained between the horn body 51 and holders 7x, 7y by thin sheet connectors 6b, 6b at a 1st position Pb on one edge of the horn body 51, and, having a structure that maintains a space between the horn body 51 and holders 7x, 7y by second thin sheet connectors 6a, 6a at a 2nd position separated a prescribed distance from the edge of the horn body 51 on an edge in another direction, the horn body 51 is fixed to holding members 8, 8 by the holders 7x, 7y.

To describe further, the ultrasonic vibration transmitter (horn) 5 has a horn body 51 that is formed in a solid form (respective columnar shape) of a prescribed length. This horn body 51 is constructed in one piece with holders 7x, 7y facing the center of the horn body 51 and 2 thin sheet connectors 6a, 6b disposed at different axial positions Pa, Pb of the horn body 51 in order to maintain a space between the horn body 51 and the holders 7x, 7y.

The horn body 51 is formed as a right-angled parallelepiped of a length of about one half wavelength ($\lambda$/2) of 1 wavelength $\lambda$ of an ultrasonic wave. The $1^{st}$ position Pb on one end of the horn body 51 is on the anti-node position of the horn body 51 when ultrasonic waves are applied to the horn body 51, and flat thin sheet connectors 6b, 6b are interposed between the abovementioned anti-node of the horn body 51 and the respective holders 7x, 7y.

Furthermore, holder 7x and holder 7y are respectively constructed as follows. That is, holder 7x and holder 7y are respectively formed with a length of about $\lambda$/4 of the ultrasonic wave oscillation used and in the shape of a rectangular column having a prescribed weight at a prescribed volume; construction is such that holder 7x or holder 7y can fix holding elements 8, 8.

The $2^{nd}$ position Pa separated at a prescribed distance at the other end from the abovementioned end of the horn body 51 is at the node of the horn body 51; S-shaped thin sheet connectors 6a, 6a are interposed at the node between the horn body 51 and the respective holders 7x, 7y.

The holding structure 2 will now be further described. The ultrasonic vibration transmitter (horn) 5 transmits a longitudinally vibrating ultrasonic wave and, as shown in FIGS. 4 and 5, has a horn body 51 with a length of about one half wavelength $\lambda$ of the ultrasonic vibration. The horn body 51 has a rectangular column shape up to the vicinity of the 2nd position Pa, the edge at a distance of $\lambda$/4 from the 1st position Pb at the ultrasonic wave input side edge, i.e., the position of another edge of the horn body 51. From the 2nd position, seen in FIGS. 4 and 5, it gradually tapers downwards for a prescribed length Lc and, from this prescribed length Lc over a prescribed length Ld up to the tip on the other side, it has a uniform thickness D.

At the 1$^{st}$ position, the ultrasonic input end edge, when ultrasonic vibrations are input to the horn, it becomes the anti-node position of the standing wave located on the horn body 51. Also, at the 2$^{nd}$ position Pa, when ultrasonic vibrations are input to the horn, it becomes the node position of the standing wave located on the horn 5. That is, the 1$^{st}$ position and 2$^{nd}$ position have a λ/4 relation on the horn body 51 of the horn 5.

The S-shaped connectors 6a are constructed in respective S-shapes at a prescribed thickness of less than about 5/100 of one wavelength λ of an ultrasonic wave; the planes of the respective S-shaped thin sheet connectors 6a form a parallel disposition to the wave surface of the longitudinal vibrating ultrasonic waves. The longitudinally vibrating ultrasonic waves are densely propagated in the transmission direction.

Similarly, the flat thin sheet connectors 6b are constructed in flat plates at a prescribed thickness of less than 3/100 of one wavelength λ of the transmitted ultrasonic waves, and the flat plate surfaces of the flat thin sheet connectors 6b are parallel to the wave surface of the longitudinally vibrating ultrasonic waves.

With an ultrasonic vibration welding device equipped with an ultrasonic vibration transmission mechanism 1 and a holding structure 2 thus constructed, pieces to be welded (workpieces) W1, W2 are loaded on a workpiece loading anvil 9, the ultrasonic vibration transmission mechanism 1 is lowered, pieces to be welded (workpieces) W1, W2 are kept at increasing pressure between the tips of the horn 5 and the anvil 9, and thus, the workpieces are welded together by applying ultrasonic vibrations to the horn 5.

Now, the ultrasonic vibration welding devise operates as follows. That is, the ultrasonic electrical energy from the ultrasonic vibration generator (not shown in the figures) is converted to mechanical vibration energy in a converter (ultrasonic wave oscillator) 3. This mechanical vibration energy is supplied to the ultrasonic vibration transmitter (horn) 5 after being amplified by a booster 4. After the ultrasonic vibration transmitter (horn) 5 resonates with mechanical vibrations, the mechanical vibration energy of this resonance is applied to the workpieces. As a result, friction heat occurs on the pieces to be welded (workpieces) W1, W2 situated between the tip of the horn 5 and the anvil 9. The pieces to be welded (workpieces) are then welded together by the friction heat occurring on these pieces to be welded (workpieces) W1, W2. In this way, the pieces to be welded (workpieces) W1, W2 can be welded by friction heat on the pieces to be welded (workpieces) W1, W2 applying ultrasonic mechanical vibration energy from the ultrasonic vibration transmitter (horn) 5 resonating with ultrasonic vibrations to the pieces to be welded (workpieces) W1, W2.

In addition, the ultrasonic vibration transmitter (horn) 5 is made into one piece comprising the horn body 51, the thin sheet connectors 6a, 6b and holders 7x, 7y; because of the construction in which the thin sheet connectors 6a, 6b are placed at a λ/4 position, the ultrasonic vibration transmitter (horn 5) can be solidly held in a condition of strengthened mechanical intensity.

With the holding structure of the ultrasonic vibration transmission mechanism constructed as above, an ultrasonic vibration transmitter (horn) 5 is formed on a horn body 51 of an approximately one half wavelength of the ultrasonic wave, respective thin sheet connectors 6a, 6b are placed on a 2nd position Pa and a 1st position Pb of the horn body 51, the horn body 51, the thin sheet connectors 6a, 6b and holders 7x, 7y are made in one piece, the holders 7x, 7y are fixed to holding elements 8, 8, and the flat surfaces of the thin sheet connectors 6a, 6b are disposed parallel to the wave surface of longitudinally vibrating ultrasonic waves; wherefore, the following excellent effects are manifested.

First, as the embodiment adopts such a construction, the holding rigidity of the ultrasonic vibration transmitter is enhanced.

Additionally, as the embodiment adopts such a construction, the withstand load of the ultrasonic vibration transmitter is enhanced compared to that of prior art.

Furthermore, as the embodiment adopts such a construction, even with a transverse load on the ultrasonic vibration transmitter, there is little displacement imparted to the ultrasonic vibration transmission mechanism, including the ultrasonic vibration transmitter.

Figure 6:
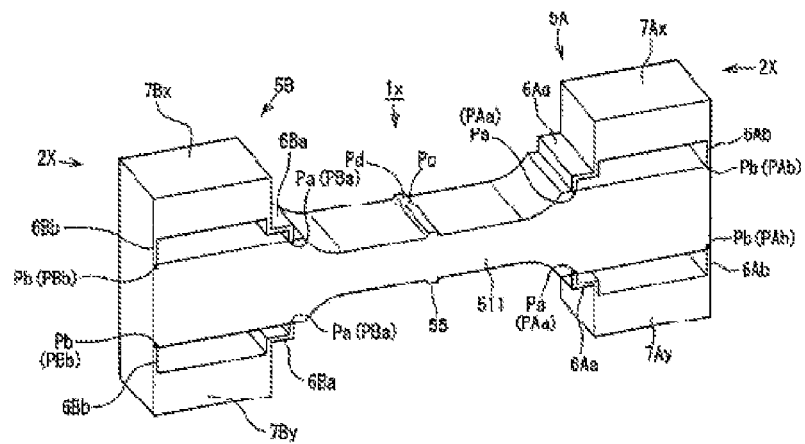
FIG. 6 is an oblique view showing the holding structure relating to another embodiment of the invention.
Figure 7:
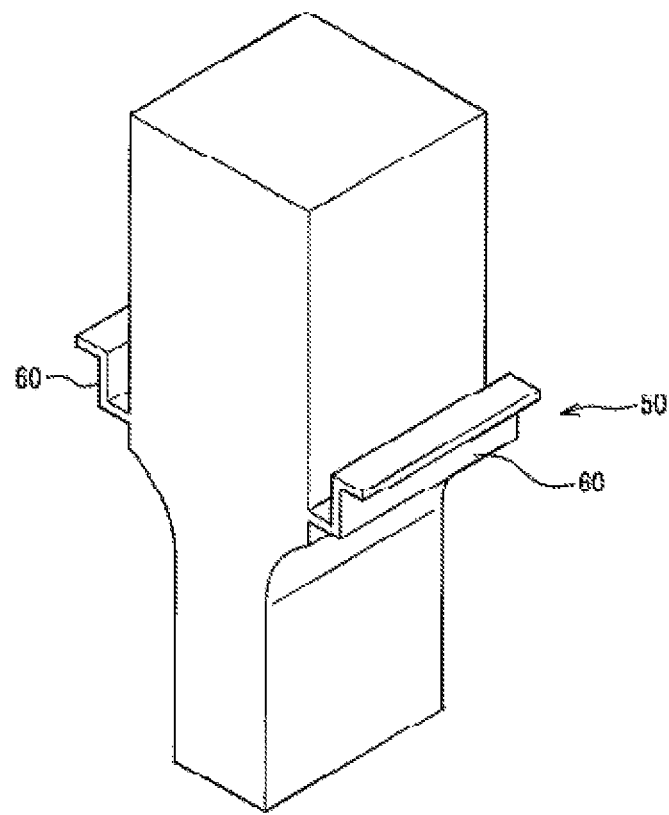
FIG. 7 is an oblique view showing the holding structure of an ultrasonic vibration transmission mechanism in the ultrasonic vibration welding device of prior art.
Figure 8:
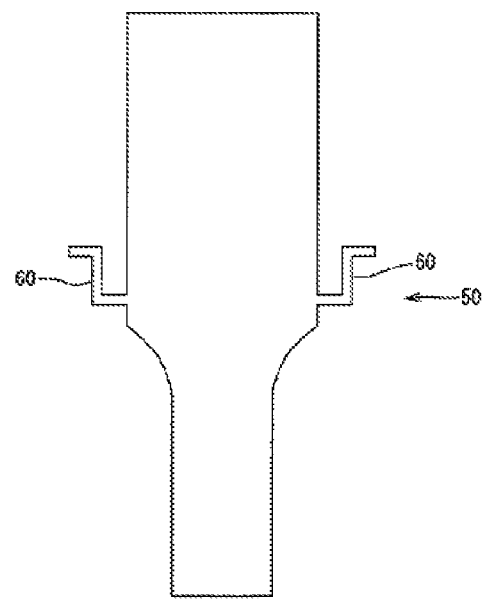
FIG. 8 is a side view showing the holding structure of an ultrasonic vibration transmission mechanism in the ultrasonic vibration welding device of prior art.

FIG. 6 is an explanatory drawing showing the holding structure of an ultrasonic vibration mechanism according to another embodiment of the invention. Using the same reference numerals for the same construction elements as in the holding structure of the ultrasonic vibration transmission mechanism shown in FIGS. 1 to 5, a detailed description can be brief.

As shown in FIG. 6, the holding structure 2x of the ultrasonic vibration transmission mechanism 1x according to the other embodiment of the invention is made in one piece in a form in which the tip Pc of the 1st ultrasonic vibration transmitter (horn) 5A having the exact same holding structure as the abovementioned embodiment and the tip Pd of the 2nd ultrasonic vibration transmitter (horn) 5B having the exact same holding structure as the abovementioned embodiment are placed against each other. In this ultrasonic vibration transmission mechanism 1x, the tip Pc of the 1st ultrasonic vibration transmitter (horn) 5A and the tip Pd of the 2nd ultrasonic vibration transmitter (horn) 5B are made into one piece by being placed against each other. The part 55 corresponding to the point at which they abut becomes the point of operation; ultrasonic mechanical vibration energy is supplied from the part 55 to the workpieces.

Subsequently, the combined length of the ultrasonic vibration transmitters (horn) 5A, 5B is one wavelength λ of the ultrasonic wave being used. The 1$^{st}$ positions Pb, Pb of the ultrasonic vibration transmitters (horn) 5A, 5B are the anti-nodal part of the amplitude, the 2$^{nd}$ positions Pa, Pa of the ultrasonic vibration transmitters (horn) 5A, 5B are the nodal part of the amplitude, and the part 55 corresponding to the point at which they abut is the anti-nodal part of the amplitude.

The ultrasonic vibration transmitter (horn) 5A has a construction in which the horn body 511, holders 7Ax, 7Ay facing the center of the horn body 511 on one edge of the horn body 511 and two thin sheet connectors 6Aa, 6Ab disposed at different axial positions PAa, PAb of the horn body 511 to maintain a space between the horn body 511 and the holders 7Ax, 7Ay are made in one piece; similarly, the ultrasonic vibration transmitter (horn) 5B also has a construction in which the horn body 511, holders 7Bx, 7By facing the center of the horn body 511 on another edge of the horn body 511 and two thin sheet connectors 6Ba, 6Bb disposed at different axial positions PBa, PBb of the horn body 511 to maintain a space between the horn body 511 and the holders 7Bx, 7By are made in one piece.

Such a holding structure 2x of an ultrasonic vibration transmitter 1x according to the other embodiment of the invention disposes thin sheet connectors 6a, 6a and holders 7x, 7y on both sides of the horn body and disposes thin sheet connectors 6a, 6a and holders 7x, 7y respectively facing the center of the horn body 511; wherefore, the following effects succeed.

By means of the holding structure of the ultrasonic vibration transmission mechanism of the other embodiment of the invention, the holding rigidity of the ultrasonic vibration transmitter is enhanced because there is a holding structure on both sides of the body.

Moreover, by means of the holding structure of the ultrasonic vibration transmission mechanism of the other embodiment of the invention, the withstand load of the ultrasonic vibration transmitter is enhanced compared to that in prior art.

Furthermore, by means of the holding structure of the ultrasonic vibration transmission mechanism of the other embodiment of the invention, even with a transverse load on the ultrasonic vibration transmitter, there is little displacement imparted to the ultrasonic vibration transmission mechanism, which includes the ultrasonic vibration transmitter.

EXPLANATION OF REFERENCE NUMERALS 1, 1x ultrasonic vibration transmission mechanism
2, 2x holding structure
3 converter
4 booster
5 horn
51, 511 horn body
6a, 6b, 6Aa, 6Ab, 6Ba, 6Bb thin sheet connectors
7x, 7y, 7ax, 7ay, 7bx, 7By holders
8 holding member

The invention claimed is:

1. A holding structure of an ultrasonic vibration mechanism, comprising:
a horn body formed as a solid body having a length that is nearly a length of half a wavelength of an applied ultrasonic wave applied to the horn body by an ultrasonic vibration welding device in which the holding structure is disposed;
the horn body having a first position Pb that is at an input end at which the applied ultrasonic wave is applied to the horn body and a second position Pa spaced a prescribed distance from the first position Pb that is ¼ a wavelength of the applied ultrasonic wave;
at least one holder disposed on a side of the horn body with thin sheet connectors associated with that holder extending between that holder and the horn body to maintain a space between the horn body and that holder, the thin sheet connectors including a flat thin sheet connector extending between the horn body from the first position Pb of the horn body to that holder, and a S-shaped thin sheet connector extending between the horn body from the second position Pa to that holder;
the horn body, each holder and associated thin sheet connectors constructed in one piece; and
each holder holders affixable to an associated holding element of the ultrasonic vibration welding device.

2. The holding structure of the ultrasonic vibration transmission mechanism of claim 1 wherein the first position Pb is at an anti-nodal area of the horn body when the applied ultrasonic wave is applied to the horn body with each flat thin sheet connector interposed between the anti-nodal area and its associated holder and the second position Pa is at a nodal area of the horn body with each S-shaped thin sheet connector interposed between the nodal area and its associated holder.

3. The holding structure of the ultrasonic vibration transmission mechanism of claim 1 wherein each S-shaped thin sheet connector is constructed at a prescribed thickness of less than 5/100 of the wavelength of the ultrasonic wave, each flat thin sheet connector is constructed at a prescribed thickness of less than 3/100 of the wavelength of the ultrasonic wave, and a flat surface of each S-shaped thin sheet connector and each flat thin sheet connector is disposed parallel to a wave surface of longitudinally vibrating ultrasonic waves of the applied ultrasonic wave.

4. The holding structure of the ultrasonic vibration transmission mechanism of claim 1 including at least another said holder disposed on another side of the horn body.

5. The holding structure of the ultrasonic vibration mechanism of claim 4 wherein the sides of the horn body on which the holders are disposed are opposite sides of the horn body.

6. The holding structure of the ultrasonic vibration transmission mechanism of claim 2 including at least another said holder disposed on another side of the horn body.

7. The holding structure of the ultrasonic vibration mechanism of claim 6 wherein the sides of the horn body on which the holders are disposed are opposite sides of the horn body.

8. The holding structure of the ultrasonic vibration transmission mechanism of claim 3 including at least another said holder disposed on another side of the horn body.

9. The holding structure of the ultrasonic vibration mechanism of claim 8 wherein sides of the horn body on which the holders are disposed are opposite sides of the horn body.

* * * * *